(12) United States Patent
Tang et al.

(10) Patent No.: US 9,472,750 B2
(45) Date of Patent: Oct. 18, 2016

(54) METHOD AND SYSTEM FOR PROVIDING A BOTTOM PINNED LAYER IN A PERPENDICULAR MAGNETIC JUNCTION USABLE IN SPIN TRANSFER TORQUE MAGNETIC RANDOM ACCESS MEMORY APPLICATIONS

(71) Applicant: Samsung Electronics Co., LTD., Gyeonggi-do (KR)

(72) Inventors: Xueti Tang, Fremont, CA (US); Dustin William Erickson, Morgan Hill, CA (US); Jang-Eun Lee, Cupertino, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/977,145

(22) Filed: Dec. 21, 2015

(65) Prior Publication Data
US 2016/0197267 A1   Jul. 7, 2016

Related U.S. Application Data

(60) Provisional application No. 62/099,875, filed on Jan. 5, 2015.

(51) Int. Cl.
*H01L 21/8234*   (2006.01)
*H01L 21/8244*   (2006.01)
(Continued)

(52) U.S. Cl.
CPC ............. *H01L 43/08* (2013.01); *G11C 11/161* (2013.01); *H01L 27/222* (2013.01); *H01L 43/02* (2013.01); *H01L 43/10* (2013.01); *H01L 43/12* (2013.01)

(58) Field of Classification Search
CPC ............. H01L 21/8229; H01L 27/222; H01L 29/1075; G11C 11/161; G11C 11/2259; G11C 11/2255; G11C 11/2257; G11C 11/2273

USPC .......... 438/106, 238, 602, 603, 604, 663; 257/68, 200, 201, 295, 296, E21.006, 257/E21.126, E21.127, E21.098, E21.155, 257/E21.645, E21.646, E21.661, E21.665
See application file for complete search history.

(56) References Cited

U.S. PATENT DOCUMENTS

| 7,351,483 B2 * | 4/2008 | Parkin | B82Y 10/00 428/811.1 |
| 7,804,668 B2 * | 9/2010 | Zhou | B82Y 10/00 360/324.12 |

(Continued)

OTHER PUBLICATIONS

Khan, "Effect of annealing temperature on structure and magnetic properties of L1o-FePd/CoFeB bilayer," IEEE Trans. Magn. (USA) vol. 49, Iss.7, pp. 4409-4412, Jul. 2013.
(Continued)

*Primary Examiner* — David Nhu
(74) *Attorney, Agent, or Firm* — Convergent Law Group LLP

(57) ABSTRACT

A magnetic junction and method for providing the magnetic junction are described. The magnetic junction includes free and pinned layers separated by a nonmagnetic spacer layer. The free layer is switchable between stable magnetic states when a write current is passed through the magnetic junction. The pinned layer has a perpendicular magnetic anisotropy (PMA) energy greater than its out-of-plane demagnetization energy. Providing the pinned layer includes providing a bulk PMA (B-PMA) layer, providing an interfacial PMA (I-PMA) layer on the B-PMA layer and then providing a sacrificial layer that is a sink for a constituent of the first I-PMA layer. An anneal is then performed. The sacrificial layer and part of the first I-PMA layer are removed after the anneal. Additional I-PMA layer(s) are provided after the removing. A remaining part of the first I-PMA layer and the additional I-PMA layer(s) have a thickness of not more than twenty Angstroms.

17 Claims, 9 Drawing Sheets

(51) Int. Cl.

| | | |
|---|---|---|
| H01L 43/08 | (2006.01) | |
| H01L 43/12 | (2006.01) | |
| H01L 43/02 | (2006.01) | |
| G11C 11/16 | (2006.01) | |
| H01L 43/10 | (2006.01) | |
| H01L 27/22 | (2006.01) | |

(56) References Cited

U.S. PATENT DOCUMENTS

| | | | | |
|---|---|---|---|---|
| 7,859,034 | B2* | 12/2010 | Huai | B82Y 10/00 257/295 |
| 7,932,571 | B2* | 4/2011 | Rizzo | G11C 11/16 257/421 |
| 8,058,696 | B2* | 11/2011 | Ranjan | B82Y 10/00 257/421 |
| 8,284,594 | B2* | 10/2012 | Hu | G11C 11/16 365/158 |
| 8,937,832 | B2* | 1/2015 | Kitagawa | H01L 43/08 365/158 |
| 9,178,133 | B2* | 11/2015 | Kitagawa | H01L 43/10 |
| 2006/0098354 | A1 | 5/2006 | Parkin | |
| 2007/0201265 | A1 | 8/2007 | Ranjan | |
| 2008/0117552 | A1 | 5/2008 | Zhou | |
| 2010/0072524 | A1 | 3/2010 | Huai | |
| 2013/0001716 | A1 | 1/2013 | Yamakawa | |
| 2014/0038311 | A1 | 3/2014 | Ouchi | |
| 2014/0103469 | A1 | 4/2014 | Jan | |
| 2014/0141533 | A1 | 5/2014 | Lai | |
| 2014/0170856 | A1 | 6/2014 | Nemani | |
| 2014/0299951 | A1 | 10/2014 | Guo | |
| 2014/0306304 | A1 | 10/2014 | Guo | |
| 2014/0327095 | A1 | 11/2014 | Kim | |

OTHER PUBLICATIONS

Natarajarathinam, A., "Exploration of perpendicular magnetic anisotropy material system for application in spin transfer torque—random access memory," University of Alabama Department: Electrical and Computer Engineering University, Dissertation/Thesis Dissertation/thesis No. 3540081, 2013, http://purl.lib.ua.edu/77737.

* cited by examiner

METHOD AND SYSTEM FOR PROVIDING A BOTTOM PINNED LAYER IN A PERPENDICULAR MAGNETIC JUNCTION USABLE IN SPIN TRANSFER TORQUE MAGNETIC RANDOM ACCESS MEMORY APPLICATIONS

CROSS-REFERENCE TO RELATED APPLICATIONS

This application claims the benefit of provisional Patent Application Ser. No. 62/099,875, filed Jan. 5, 2015, entitled BOTTOM PINNED LAYER WITH PLASMA TREATMENT, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a substrate 12. A bottom contact 14 and top contact 22 may be used to drive current through the conventional MTJ 10. The conventional MTJ, uses conventional seed layer(s) (not shown), may include capping layers (not shown) and may include a conventional antiferromagnetic (AFM) layer (not shown). The conventional magnetic junction 10 includes a conventional pinned layer 16, a conventional tunneling barrier layer 18, and a conventional free layer 20. Also shown is top contact 22. Conventional contacts 14 and 22 are used in driving the current in a current-perpendicular-to-plane (CPP) direction, or along the z-axis as shown in FIG. 1. Typically, the conventional pinned layer 16 is closest to the substrate 12 of the layers 16, 18 and 20.

The conventional pinned layer 16 and the conventional free layer 20 are magnetic. The magnetization 17 of the conventional pinned layer 16 is fixed, or pinned, in a particular direction. Although depicted as a simple (single) layer, the conventional pinned layer 16 may include multiple layers. For example, the conventional pinned layer 16 may be a synthetic antiferromagnetic (SAF) layer including magnetic layers antiferromagnetically coupled through thin conductive layers, such as Ru. The conventional pinned layer 16 may also be another multilayer. The conventional free layer 20 has a changeable magnetization 21. Although depicted as a simple layer, the conventional free layer 20 may also include multiple layers. The conventional pinned layer 16 and free layer 20 may have their magnetizations 17 and 21, respectively oriented perpendicular to the plane of the layers.

In order to achieve perpendicular magnetic moments 17 and 21, various structures have been proposed. For example, the conventional pinned layer 16 may include a nonmagnetic coupling layers, such as a W or Ta layer, between a bulk perpendicular magnetic anisotropy layer (B-PMA) and an interfacial perpendicular magnetic anisotropy (I-PMA) layer. The B-PMA layer has a perpendicular magnetic anisotropy due to entire layer. Such a B-PMA layer may be a Co/Pt multilayer or alloy. The I-PMA layer has its perpendicular magnetic anisotropy dominated by phenomena at the interface. For example, the interfacial perpendicular magnetic anisotropy includes layers such as CoFeB and FeB. The I-PMA, B-PMA and coupling layers all, however, have drawbacks. The B-PMA layer may have a low spin polarization, adversely affecting the magnetoresistance of the conventional magnetic junction 10. The nonmagnetic insertion layer may diffuse during fabrication, which adversely affects the perpendicular magnetic anisotropy and magnetoresistance. The I-PMA layer may not have a sufficiently high perpendicular magnetic anisotropy to adequately pin the magnetic moment 17. Thus, the magnetic junction 10 may have a low magnetoresistance, poor stability of the pinned layer 16, and/or other drawbacks. Accordingly, what is needed is a method and system that may improve the performance of the spin transfer torque based memories. The method and system described herein address such a need.

BRIEF SUMMARY OF THE INVENTION

A magnetic junction and method for providing the magnetic junction are described. The magnetic junction includes free and pinned layers separated by a nonmagnetic spacer layer. The free layer is switchable between stable magnetic states when a write current is passed through the magnetic junction. The pinned layer has a perpendicular magnetic anisotropy (PMA) energy greater than its out-of-plane demagnetization energy. Providing the pinned layer includes providing a bulk PMA (B-PMA) layer, providing an interfacial PMA (I-PMA) layer on the B-PMA layer and then providing a sacrificial layer that is a sink for a constituent of the first I-PMA layer. An anneal is then performed. The sacrificial layer and part of the first I-PMA layer are removed after the anneal. Additional I-PMA layer(s) are provided after the removing. A remaining part of the first I-PMA layer and the additional I-PMA layer(s) have a thickness of not more than twenty Angstroms.

DETAILED DESCRIPTION OF THE INVENTION

Figure 1:
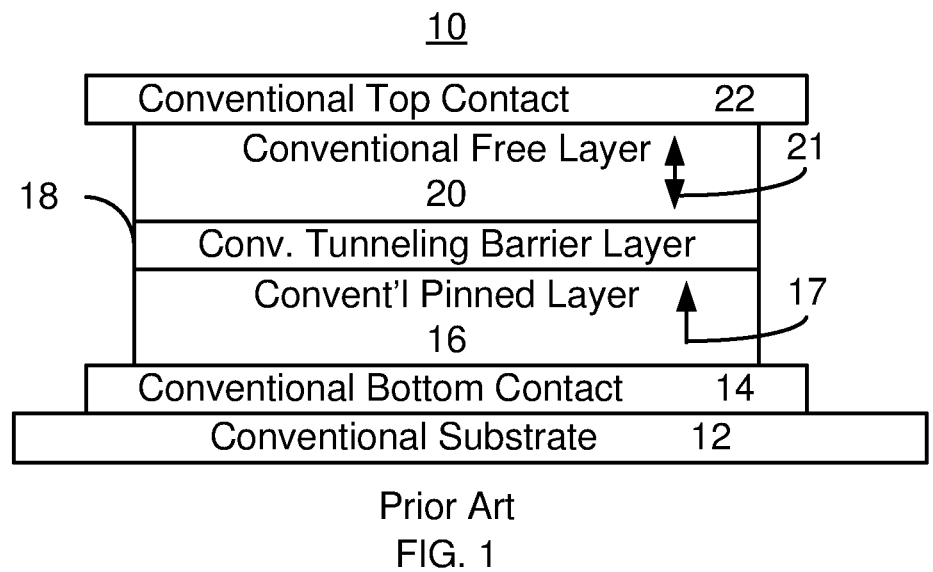
FIG. 1 depicts a conventional dual magnetic junction.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and nonportable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A magnetic junction and method for providing the magnetic junction are described. The magnetic junction includes free and pinned layers separated by a nonmagnetic spacer layer. The free layer is switchable between stable magnetic states when a write current is passed through the magnetic junction. The pinned layer has a perpendicular magnetic anisotropy (PMA) energy greater than its out-of-plane demagnetization energy. Providing the pinned layer includes providing a bulk PMA (B-PMA) layer, providing an interfacial PMA (I-PMA) layer on the B-PMA layer and then providing a sacrificial layer that is a sink for a constituent of the first I-PMA layer. An anneal is then performed. The sacrificial layer and part of the first I-PMA layer are removed after the anneal. Additional I-PMA layer(s) are provided after the removing. A remaining part of the first I-PMA layer and the additional I-PMA layer(s) have a thickness of not more than twenty Angstroms.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

Figure 2:
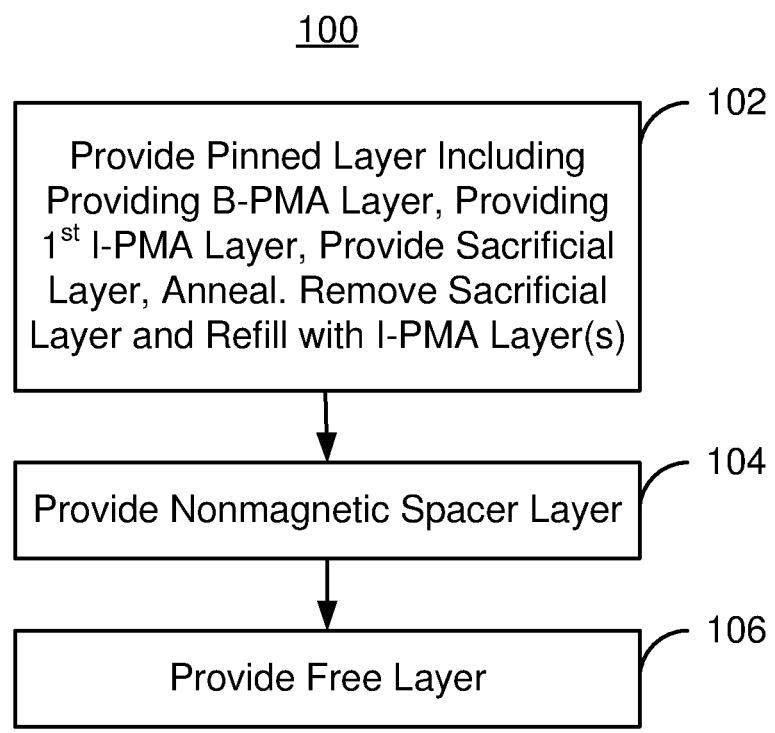
FIG. 2 flow chart depicting an exemplary embodiment of a method for providing a magnetic junction including a high perpendicular anisotropy bottom pinned layer and usable in a magnetic memory programmable using spin transfer torque.

FIG. 2 depicts an exemplary embodiment of a method 100 for fabricating a magnetic junction including a bottom pinned layer having a high perpendicular magnetic anisotropy (PMA) and usable in a magnetic device such as a STT-RAM and, therefore, in a variety of electronic devices. For simplicity, some steps may be omitted, performed in another order, include substeps and/or combined. Further, the method 100 may start after other steps in forming a magnetic memory have been performed. The method 100 is described in the context of fabricating a single magnetic junction. However, one of ordinary skill in the art may be that the method 100 is generally used to fabricate multiple magnetic junctions at substantially the same time.

A bottom pinned layer is provided, via step 102. The bottom pinned layer is so named because the pinned layer is closer to the substrate than the free layer. The bottom pinned layer has a perpendicular magnetic anisotropy (PMA) energy greater than its out-of-plane demagnetization energy. Consequently, the magnetic moment of the pinned layer may be oriented perpendicular to plane. The pinned layer is a multilayer. In some embodiments, the pinned layer may be a synthetic antiferromagnet (SAF) that includes two magnetically coupled ferromagnetic layers separated by a nonmagnetic coupling layer, such as Ru. The ferromagnetic layer(s) may be single layers or multilayers. Step 102 includes multiple substeps. A bulk perpendicular magnetic anisotropy (B-PMA) layer is provided as part of step 102. The B-PMA layer includes material(s) and a structure which has a high perpendicular magnetic anisotropy due to effects throughout the structure (i.e. the bulk of the structure). The B-PMA layer may be a multilayer including multiple repeats of a Co/Pt bilayer (otherwise denoted or $(Co/Pt)_n$), a CoPt alloy, a CoTb alloy and/or multiple repeats of a Co/Tb bilayer. Other possibilities for the B-PMA layer include, but are not limited to multiple repeats of a CoTb/FeB bilayer, a FePd alloy, a FePdB alloy, a CoPd alloy, a FePt alloy, a TbCoFe alloy, a GaMn alloy, a GeMn alloy, multiple repeats of a Co/Pd bilayer, multiple repeats of a Fe/Pt bilayer, multiple repeats of a Co/Ni bilayer, multiple repeats of a Tb/CoFe bilayer, multiple repeats of a Co/Ir bilayer, and/or multiple repeats of a Co/TbCoFe bilayer. In addition to depositing the B-PMA layer, in some embodiments, the B-PMA layer may be annealed. For example, a rapid thermal anneal (RTA) may be performed at a temperature of at least three hundred degrees Celsius and not more than four hundred degrees Celsius.

After the B-PMA layer is provided, a first interfacial magnetic anisotropy (I-PMA) layer is provided on the B-PMA layer as part of step 102. The first I-PMA layer includes material(s) and a structure which has a high perpendicular magnetic anisotropy due to effects near the interfaces of the structure with other layers (i.e. the interface of the structure). The material(s) usable in the I-PMA include but are not limited to CoFeB, FeB, CoB, Fe, $Co_2FeAl$, $Co_2FeAlSi$, $Co_2MnSi$ and MnAl. For example, in some embodiments, a CoFeB layer is provided. The CoFeB layer may be a $(CoFe)_{1-x}B_x$ layer, where x is at least 0.2 and not more than 0.5. For example, x may be nominally 0.4. In general, alloys mentioned herein do not indicate specific stoichiometries unless specifically mentioned. For example, the term CoFeB indicates an alloy of Co, Fe and B. The term CoFeB is intended to indicate an alloy having at least twenty percent and not more than fifty atomic percent B alloyed with CoFe, as discussed above. The term CoFeB is not intended to be restricted to an alloy having equal amounts of Co, Fe and B. The first I-PMA layer includes magnetic material(s) and a constituent that may tend to diffuse. This constituent is nonmagnetic. In some embodiments, this constituent is B. Also as part of step 102, a sacrificial layer is provided on the first I-PMA layer. The sacrificial layer is a sink for the constituent. Stated differently, the sacrificial layer has a high affinity for the constituent. In some embodiments, the sacrificial layer is a Ta layer. Ta has a high affinity for B. Once the sacrificial layer is present, an anneal is performed as part of step 102. The anneal thus heat treats the B-PMA layer, the first I-PMA layer and the sacrificial layer. The anneal is at an anneal temperature of at least two hundred degrees Celsius and not more than four hundred degrees Celsius. In some embodiments, the anneal is at a temperature of at least three hundred degrees Celsius. For example, the anneal may be performed at a temperature of nominally three hundred and fifty degrees Celsius.

After the anneal is performed, step 102 also removes the sacrificial layer and part of the first I-PMA layer. In some embodiments, this is accomplished via a plasma etch. After the plasma etch, at least one additional I-PMA layer is provided on the remaining portion of the first I-PMA layer. The remaining portion of the first I-PMA layer and the additional I-PMA layer(s) have a total thickness of not more than twenty Angstroms. The materials usable for the additional I-PMA layer(s) include but are not limited to CoFeB, FeB, CoB, Fe, $Co_2FeAl$, $Co_2FeAlSi$, $Co_2MnSi$ and MnAl. If multiple additional I-PMA layers are used, then different materials may be used. Further, these layers are not separated by nonmagnetic layers. For example, the additional I-PMA layer(s) may include a CoFeB layer and an FeB layer.

The edges of the pinned layer may be defined immediately after deposition or at a later time. For example, once the remaining layers of the magnetic junction have been deposited, the magnetic junction may be defined. In some embodiments, an ion mill may be performed. Thus, portions of step 102 may be spread out over time.

A nonmagnetic spacer layer is provided, via step 104. Step 104 may include depositing an MgO layer to form a tunneling barrier layer. In other embodiments, the nonmagnetic spacer layer may be a conductor, another insulating tunneling barrier layer or have another structure and/or other materials. The edges of the nonmagnetic spacer layer may be defined immediately after deposition or at a later time.

A free layer that may have a free layer having perpendicular anisotropy energy that exceeds the free layer out-of-plane demagnetization energy is provided on the substrate, via step 106. Thus, the free layer may have a perpendicular-to-plane magnetic moment. In some embodiments, step 106 includes depositing the material(s) for the free layer. The edges of the magnetic junction and those of the free layer, may be defined immediately after deposition or at a later time. The free layer may be a single layer or a multilayer. In some embodiments, the free layer may be a SAF that includes two magnetically coupled ferromagnetic layers separated by a nonmagnetic coupling layer, such as Ru. The ferromagnetic layer(s) may be single layers or multilayers. For example, the free layer may include a CoFeB layer, a W layer, a second CoFeB layer and a second W layer. These layers may form the entirety of the free layer or may form one of the ferromagnetic layers in a SAF. Other multilayers are possible.

Fabrication of the magnetic junction may then be completed. This may include providing an additional nonmagnetic spacer layer and an additional pinned layer for a dual magnetic junction. A capping layer, contacts, and other structures may also be provided. If the edges of the magnetic junction have not been defined, then this is accomplished. Thus, a portion of the layers corresponding to the junction(s) may be covered by a mask and the exposed regions ion milled. Thus, the magnetic junction may be provided. This magnetic junction may be one of many in a magnetic memory, such as STT-RAM.

Using the method 100, the magnetic junction having improved performance may be formed. In particular, a bottom pinned layer having a perpendicular magnetic anisotropy energy that exceeds the out-of-plane demagnetization energy may be achieved. The coupling between the I-PMA layer(s) and B-PMA layer may be enhanced, allowing for greater stability of the pinned layer. A higher spin polarization material may be used, allowing for improved writing. Magnetoresistance, such as tunneling magnetoresistance (TMR) may also be enhanced. Thus, performance the magnetic junction formed using the method 110 may be improved.

Figure 3:
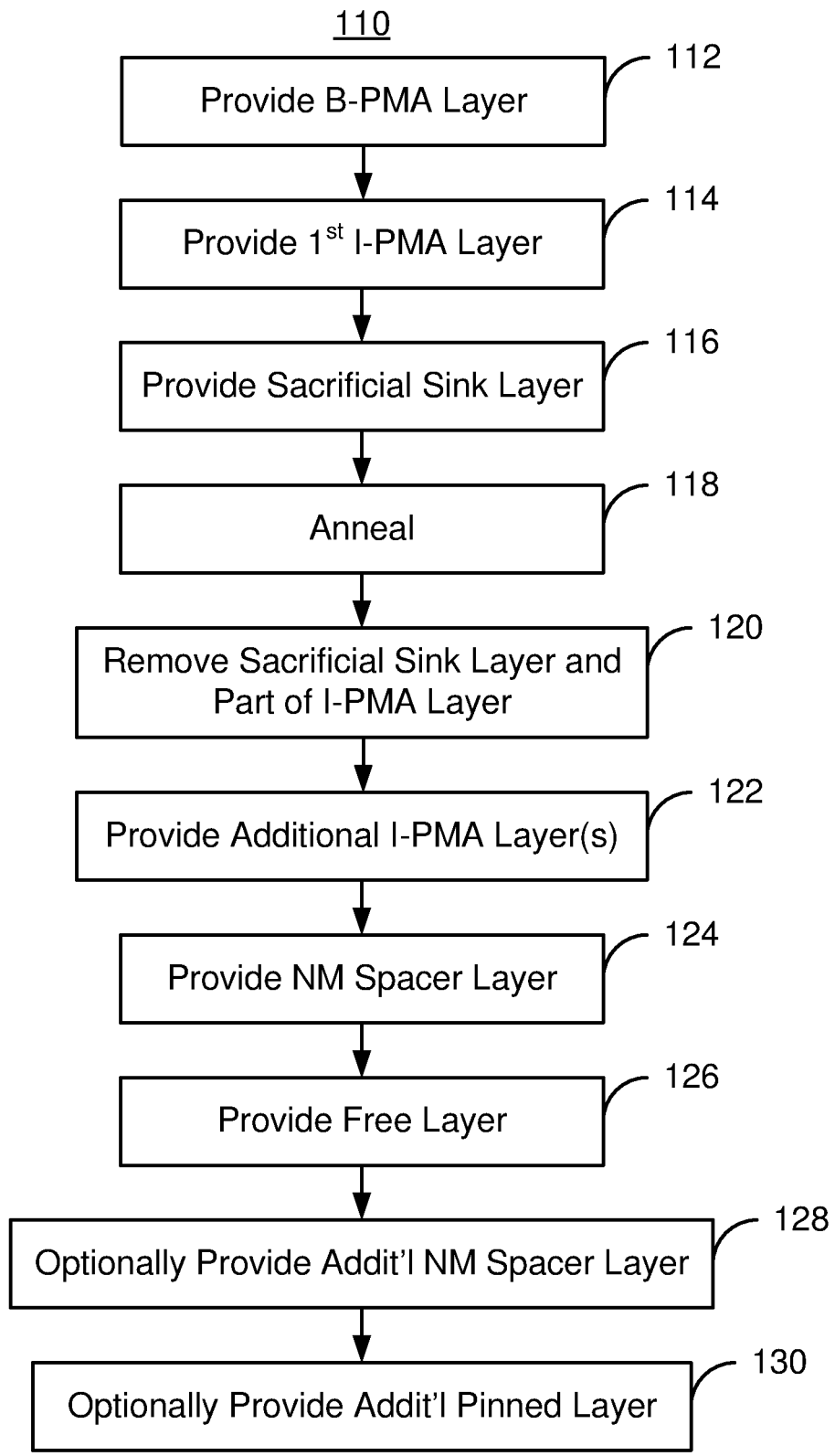
FIG. 3 flow chart depicting another exemplary embodiment of a method for providing a magnetic junction including a high perpendicular anisotropy bottom pinned layer and usable in a magnetic memory programmable using spin transfer torque.

FIG. 3 depicts an exemplary embodiment of a method 110 for fabricating a magnetic junction including a bottom pinned layer and usable in a magnetic device such as a STT-RAM and, therefore, in a variety of electronic devices. For simplicity, some steps may be omitted, performed in another order, include substeps or combined. Further, the method 110 may start after other steps in forming a magnetic memory have been performed. FIGS. 4-9 depict an exemplary embodiment of a magnetic junction 200 that may be fabricated using the method 110. FIGS. 4-9 depict the magnetic junction 200 during fabrication. FIGS. 4-9 are not to scale. Referring to FIGS. 3-9, only a portion of the final magnetic junction 200 is shown in some drawings. The method 110 is described in the context of the magnetic junction 200. However, other magnetic junctions may be formed. Further, the method 110 is described as forming the magnetic junction 200. However, multiple magnetic junctions may be simultaneously fabricated.

A B-PMA layer is provided, via step 112. The B-PMA layer includes material(s) and a structure which has a high perpendicular magnetic anisotropy due to effects throughout the structure (i.e. the bulk of the structure). The PMA energy is greater than the out-of-plane demagnetization energy of the B-PMA layer. The B-PMA layer may be include the same material(s) and have the same structure as the B-PMA layer described above. For example, the B-PMA layer may be a multilayer including multiple repeats of a Co/Pt bilayer, a CoPt alloy, a CoTb alloy and/or multiple repeats of a Co/Tb bilayer. Other possibilities for the B-PMA layer include the materials described above. Step 112 may also include annealing the B-PMA layer. For example, a rapid thermal anneal (RTA) may be performed at a temperature of at least three hundred degrees Celsius and not more than four hundred degrees Celsius. In some embodiments, an anneal temperature may be nominally three hundred and fifty degrees Celsius.

Figure 4:
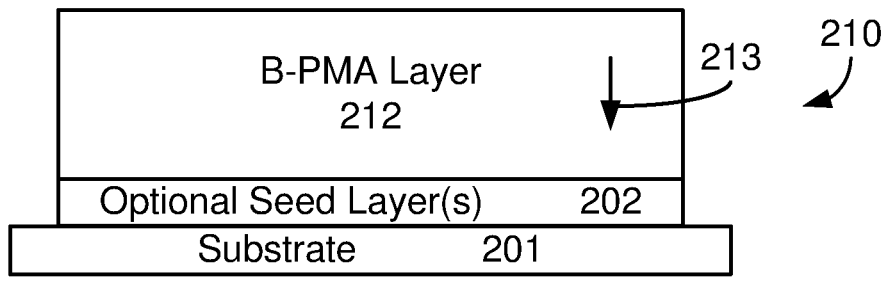
FIGS. 4-9 depict an exemplary embodiment of a magnetic junction including a high perpendicular magnetic anisotropy pinned layer and usable in a magnetic memory programmable using spin transfer torque.

FIG. 4 depicts an exemplary embodiment of the magnetic junction 200 after step 112 is performed. Thus, a B-PMA layer 212 is shown on optional seed layer(s) 202. The seed layer(s) 202 may include an MgO layer. The B-PMA layer 212 and seed layer(s) 202 may be provided on the substrate 201. The B-PMA layer 212 includes magnetic moment 213. The B-PMA layer 212 is part of the pinned layer 210 being formed. Because the PMA energy exceeds the out-of-plane demagnetization energy, the magnetic moment 213 of the B-PMA layer 212 is perpendicular to plane. In some embodiments, for example, the thickness of the B-PMA layer may be at least twenty-five Angstroms and not more than thirty Angstroms.

After the B-PMA layer is provided, a first I-PMA layer is provided on the B-PMA layer, via step 114. The first I-PMA layer may include the material(s) described above. For example, the I-PMA be a CoFeB layer. In some embodiments, the I-PMA layer includes is at least twenty percent and not more than fifty percent B. In some embodiments, forty percent of B may be used. The I-PMA layer includes a material, such as B, that may diffuse.

Figure 5:
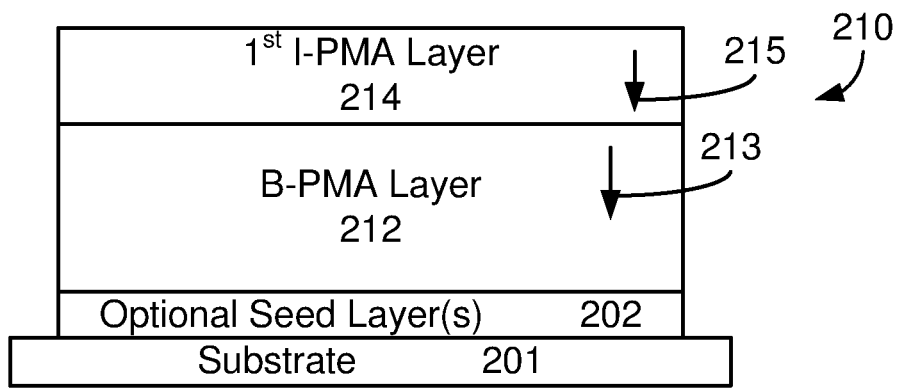

FIG. 5 depicts the magnetic junction 200 after step 114 is performed. Thus, the first I-PMA layer 214 having magnetic moment 215 is shown. The thickness of the first I-PMA layer may be at least ten Angstroms and not more than twenty Angstroms. The I-PMA layer 214 is part of the pinned layer 210 being formed. Because the PMA energy is greater than the out-of-plane demagnetization energy, the magnetic moment 215 is perpendicular to plane for the I-PMA layer 214. In the embodiment shown, the magnetic moments 213 and 214 are oriented down, in the direction of the substrate 201. However, in other embodiments, the magnetic moments 213 and 215 may be oriented in the opposite direction.

Figure 6:
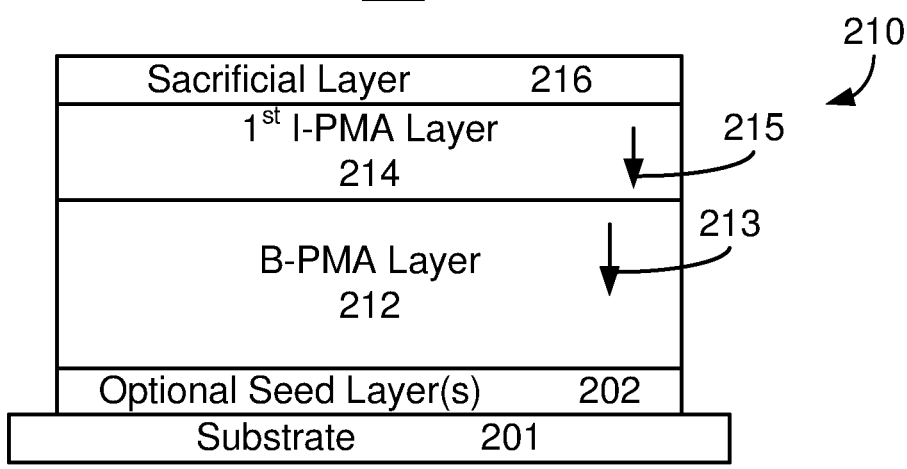

A sacrificial layer is provided on the first I-PMA layer 214, via step 116. The sacrificial layer is a sink for the constituent that diffuses. For example, the sacrificial layer is a Ta layer having a high affinity for B. FIG. 6 depicts the magnetic junction after step 116 is performed. Thus, the sacrificial layer 216 is shown. The sacrificial layer 216 may have a thickness of at least two Angstroms and not more than five Angstroms.

After the sacrificial layer 216 has been formed, an anneal is performed, via step 118. The anneal thus heat treats the B-PMA layer 212, the first I-PMA layer 214 and the sacrificial layer 216. The anneal may be an RTA. The anneal is at an anneal temperature of at least two hundred degrees Celsius and not more than four hundred degrees Celsius. In some embodiments, the anneal is at a temperature of at least three hundred degrees Celsius. For example, the anneal may be performed at a temperature of nominally three hundred and fifty degrees Celsius for not more than six hundred seconds. In other embodiments, other temperatures and times may be used. The anneal performed in step 118 aids in allowing the desired crystal structure to be formed by the first I-PMA layer 214. Because of the presence of the sacrificial layer 216, the desired constituent (such as B) in the I-PMA layer 214 may tend to migrate to the sacrificial layer 216. Consequently, the stoichiometry of the first I-PMA layer 214 may change during the anneal performed in step 118. In some embodiments, the first I-PMA layer 214 becomes poorer in the diffusing constituent. For example, a CoFeB layer used for the first I-PMA layer 214 may become B poor.

Figure 7:
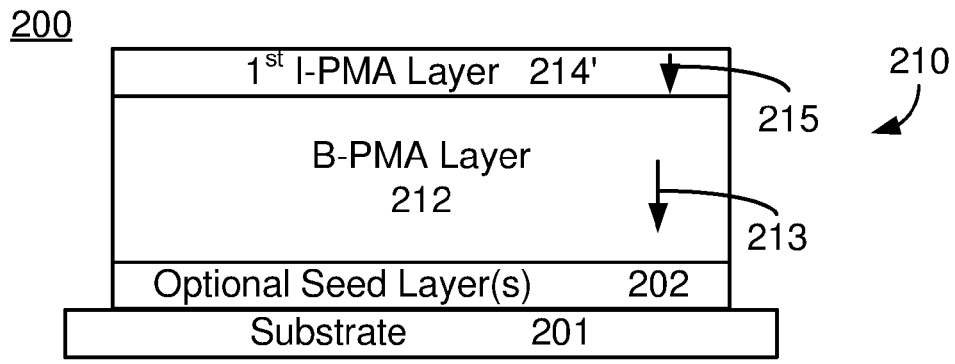

The sacrificial layer 216 and part of the first I-PMA layer 214 are removed, via step 120. In some embodiments, this is accomplished by plasma etching the magnetic junction 200. FIG. 7 depicts the magnetic junction 200 after step 120 is performed. Thus, the first I-PMA layer 214' remaining is thinner than the as-deposited I-PMA layer 214 depicted in FIGS. 4-6. In some embodiments, the first I-PMA layer 214' has a thickness that does not exceed ten Angstroms. In some embodiments, the I-PMA layer 214' is at least two Angstroms thick and not more than six Angstroms thick.

Figure 8:
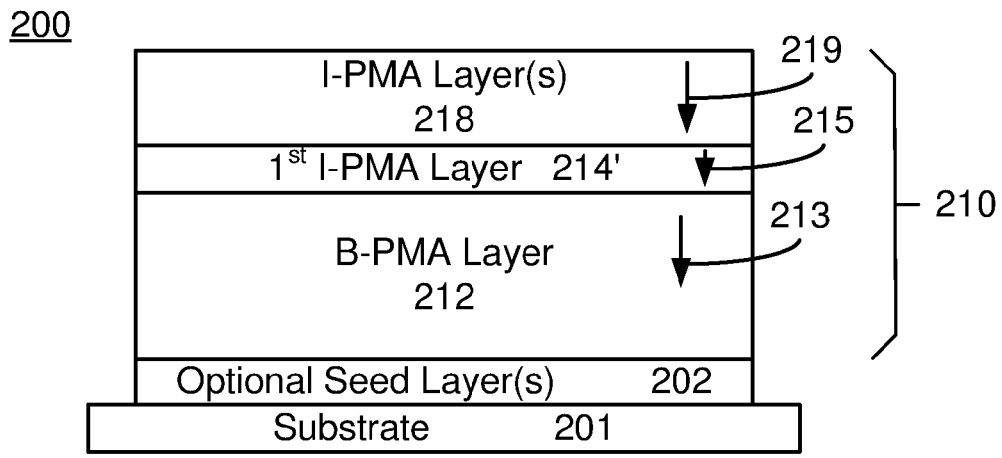

At least one additional I-PMA layer is provided on the first I-PMA layer 214' remaining, via step 122. The materials usable for the additional I-PMA layer(s) are as described above. In some embodiments, step 122 includes depositing a CoFeB layer and an FeB layer. FIG. 8 depicts the magnetic junction 200 after step 122 is performed. Thus, additional I-PMA layer(s) 218 are shown. The layers 212, 214' and 218 form the pinned layer 210. Thus, steps 112 through 122 may be analogous to the step 102 of the method 100. The total thickness of the first I-PMA layer 214' and the additional I-PMA layer(s) 218 is not more than twenty Angstroms. In some embodiments, the total thickness of the first I-PMA layer 214' and the additional I-PMA layer(s) 218 is not more than fifteen Angstroms and at least eight Angstroms. The I-PMA layer(s) 218 have a PMA energy that exceeds the out-of-plane demagnetization energy. The layer(s) 218 thus have magnetic moment 219 that may be perpendicular to plane.

Figure 9:
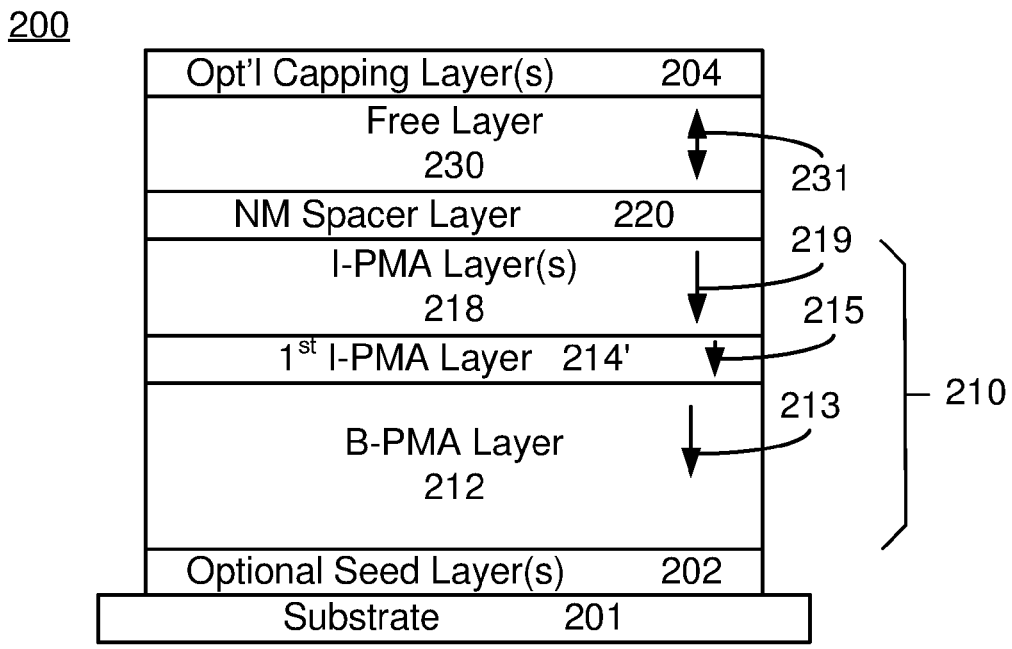

A nonmagnetic spacer layer is provided, via step 124. Step 124 may include depositing an MgO layer to form a tunneling barrier layer. A free layer that may have a free layer having perpendicular anisotropy energy that exceeds the free layer out-of-plane demagnetization energy is provided on the substrate, via step 126. Thus, the free layer may have a perpendicular-to-plane magnetic moment. FIG. 9 depicts the magnetic junction 200 after step 126 has been performed. Thus, the nonmagnetic spacer layer 220 and free layer 230 having magnetic moment 231 are shown. The nonmagnetic spacer layer 220 may be an MgO tunneling barrier layer. The PMA energy of the free layer 230 exceeds the out-of-plane demagnetization energy of the free layer 230. Thus, magnetic moment 231 may be perpendicular to plane. In addition, optional capping layer(s) 204 are shown. The optional capping layer(s) 204 may include an MgO layer. Although not shown, top and bottom contacts may be provided to drive current perpendicular to plane through the magnetic junction. Thus, the magnetic junction 200 is a single magnetic junction formed if the steps 128 and 130, described below, are omitted.

The edges of the layers 212, 214, 218, 220 and 230 may be defined immediately after deposition or at a later time. For example, once all of the layers of the magnetic junction 200 have been deposited, the magnetic junction 200 may be defined. In some embodiments, an ion mill may be performed. Thus, the edges of the magnetic junction 200 may be defined after steps 122 through 126 (or 130) are performed. Alternatively, the edges of various layers, such as the layers 212, 214', 218, 220 and 230, may be formed at other times.

If a dual magnetic junction is desired, then an additional nonmagnetic spacer layer is provided, via step 128. In some embodiments, step 128 provides a second tunneling barrier layer, such as a crystalline MgO layer. Alternatively, the additional nonmagnetic spacer layer may have another structure. For example, the additional nonmagnetic spacer layer may be a conductor. If the nonmagnetic spacer layer 220 and the nonmagnetic spacer layer provided in step 128 have the same resistance area product, then the thicknesses of the layers is generally desired to be different. For example, if both layers are tunneling barrier layers, then one of the tunneling barrier layers may be thicker.

Figure 10:
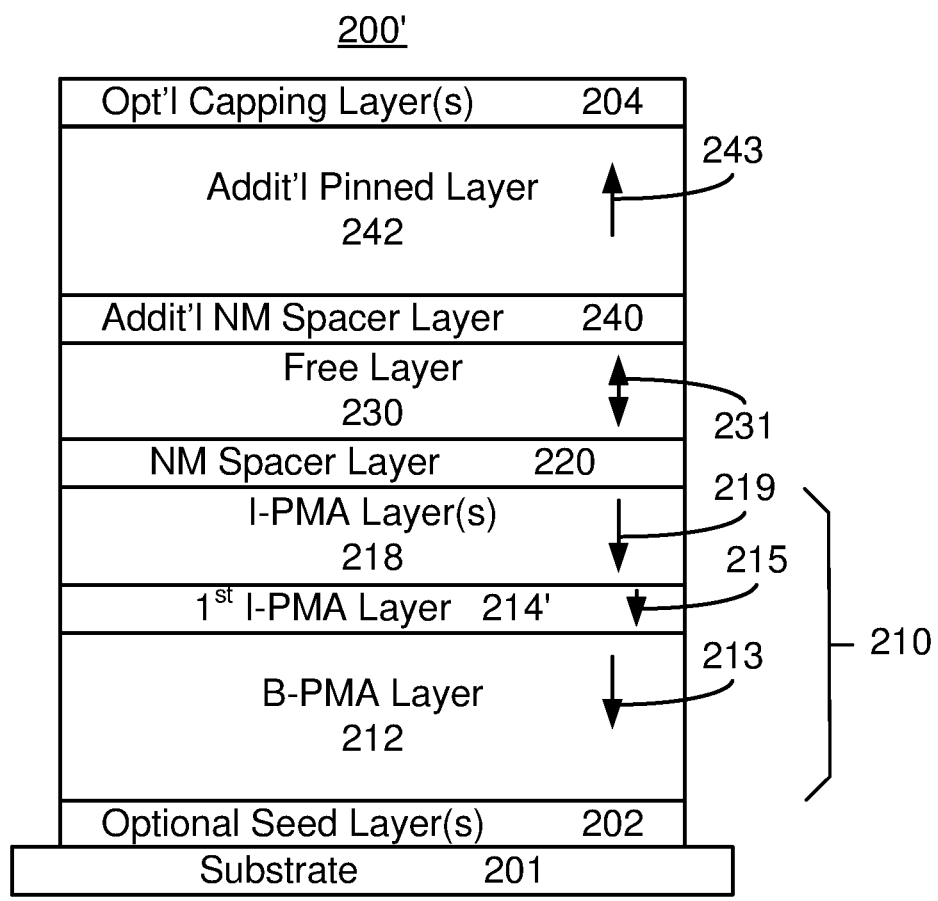
FIG. 10 depicts another exemplary embodiment of a magnetic junction including a high perpendicular magnetic anisotropy pinned layer and usable in a magnetic memory programmable using spin transfer torque.

An additional pinned layer may also be provided, via step 130. The PMA energy of the additional pinned layer is greater than its out-of-plane demagnetization energy. As a result, the magnetic moment may be perpendicular to plane. FIG. 10 depicts the magnetic junction 200' after step 130 is performed. Thus, the magnetic junction 200' is a dual magnetic junction including additional nonmagnetic spacer layer 240 and additional pinned layer 242. Because its PMA energy exceeds the out-of-plane demagnetization energy, the magnetic moment 243 of the additional pinned layer 242. As can be seen in FIG. 10, the pinned layer magnetic moments 213 and 243 are oriented in opposite directions. Thus, the magnetic junction 200' is in a dual state. In some embodiments, the additional pinned layer 242 may include B-PMA and/or I-PMA layers.

Using the method 110, the magnetic junction 200 and/or 200' having improved performance may be formed. In particular, a bottom pinned layer 210 having a stable perpendicular to plane magnetic moment 213/215/219 has been provided. A higher spin polarization I-PMA layer(s) 214' and 218 may be used, allowing for improved writing. TMR may also be enhanced. Thus, performance the magnetic junction 200/200' formed using the method 110 may be improved.

Figure 11:
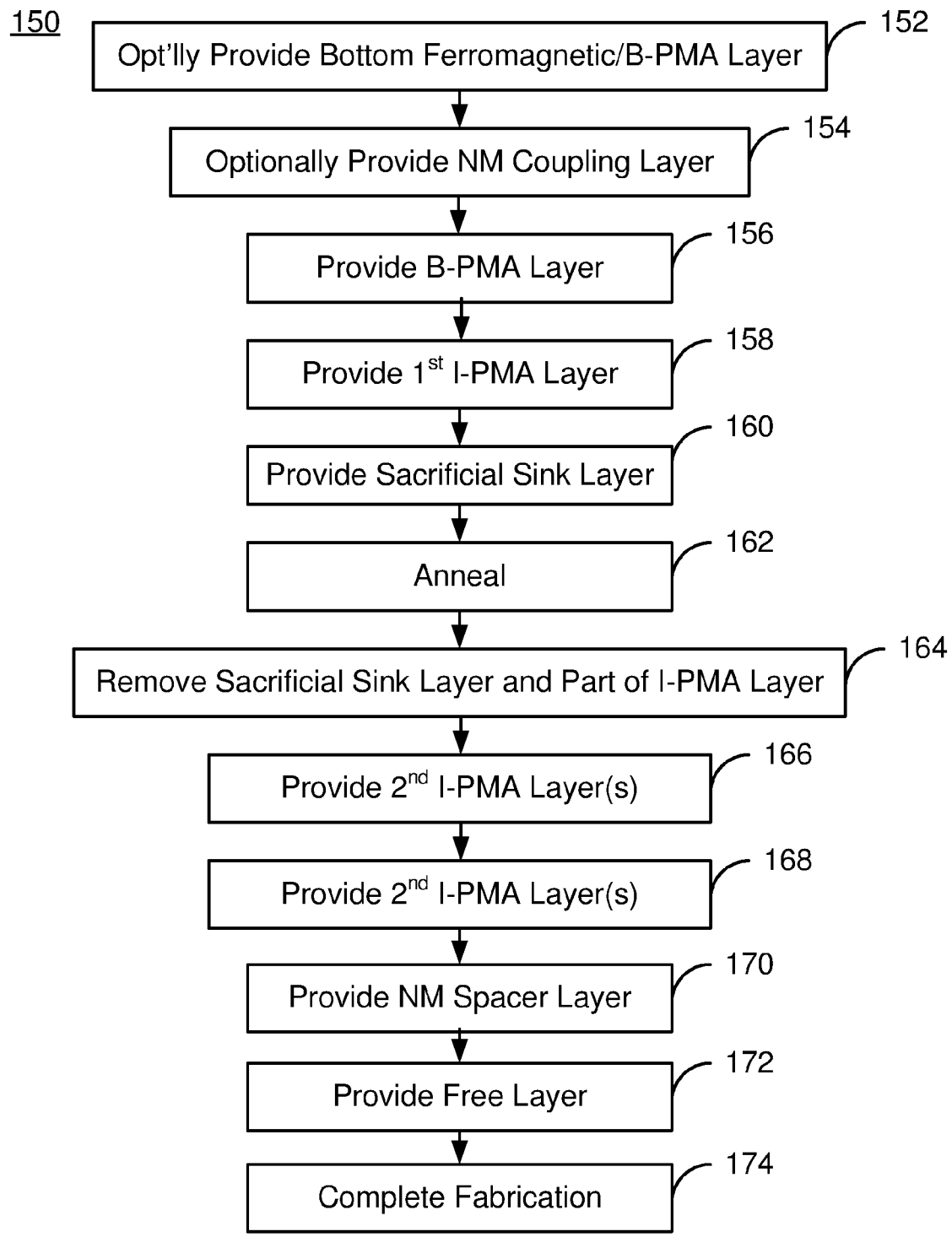
FIG. 11 flow chart depicting another exemplary embodiment of a method for providing a magnetic junction including a high perpendicular anisotropy bottom pinned layer and usable in a magnetic memory programmable using spin transfer torque.

FIG. 11 depicts an exemplary embodiment of a method 150 for fabricating a magnetic junction including a bottom pinned layer and usable in a magnetic device such as a STT-RAM and, therefore, in a variety of electronic devices. For simplicity, some steps may be omitted, performed in another order, include substeps or combined. Further, the method 150 may start after other steps in forming a magnetic memory have been performed. FIGS. 12-16 depict an exemplary embodiment of a magnetic junction 250 that may be fabricated using the method 150. FIGS. 12-16 depict the magnetic junction 250 during fabrication and 9 are not to scale. Referring to FIGS. 11-16, only a portion of the final magnetic junction 250 is shown in some drawings. The method 110 is described in the context of the magnetic junction 250. However, other magnetic junctions may be formed. Further, the method 140 is described as forming the magnetic junction 250. However, multiple magnetic junctions may be simultaneously fabricated.

In the embodiment depicted in FIG. 11, a bottom pinned layer that is also a SAF may be fabricated. If the pinned layer formed in the method 150 is not to be a SAF, then steps 152 and 154 may be skipped. A bottom ferromagnetic layer is provided, via step 152. The B-PMA layer has a PMA energy greater than the out-of-plane demagnetization energy of the B-PMA layer. The B-PMA layer may be include the same material(s) and have the same structure as the B-PMA layer described above. For example, the B-PMA layer may be a multilayer including multiple repeats of a Co/Pt bilayer, a CoPt alloy, a CoTb alloy and/or multiple repeats of a Co/Tb bilayer. Other possibilities for the B-PMA layer include the materials described above.

A nonmagnetic coupling layer, such as a Ru layer, is provided, via step 154. The nonmagnetic coupling layer has a thickness such that the ferromagnetic layer provided in step 154 and the layer provide and steps 156 through 168 are magnetically coupled as desired. Generally, these layers are desired to be antiferromagnetically coupled. In other embodiments, the thickness of the coupling layer may be selected to provide ferromagnetic coupling.

A B-PMA layer is provided, via step 156. The PMA energy is greater than the out-of-plane demagnetization energy of the B-PMA layer. The B-PMA layer may be include the same material(s) and have the same structure as the B-PMA layer described above. For example, the B-PMA layer may be a multilayer including multiple repeats of a Co/Pt bilayer, a CoPt alloy, a CoTb alloy and/or multiple repeats of a Co/Tb bilayer. Other possibilities for the B-PMA layer include the materials described above. Step 156 may also include annealing the B-PMA layer. For example, a RTA may be performed at a temperature of at least three hundred degrees Celsius and not more than four hundred degrees Celsius. Step 156 is analogous to the step 112.

After the B-PMA layer is provided, a first I-PMA layer is provided on the B-PMA layer, via step 158. The first I-PMA layer may include the material(s) described above. For example, the I-PMA be a CoFeB layer. In some embodiments, the I-PMA layer includes is at least twenty percent and not more than fifty percent B. The I-PMA layer includes a material, such as B, that may diffuse. Step 158 is analogous to the step 114.

A sacrificial layer is provided on the first I-PMA layer, via step 160. The sacrificial layer is a sink for the constituent that diffuses. For example, the sacrificial layer is a Ta layer having a high affinity for B. Step 160 is analogous to step 116.

Figure 12:
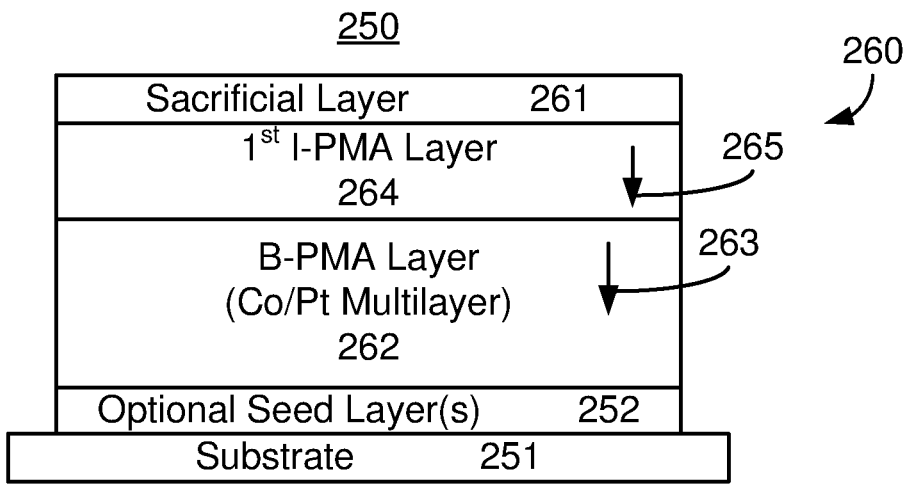
FIGS. 12-15 depict another exemplary embodiment of a magnetic junction including a high perpendicular magnetic anisotropy pinned layer and usable in a magnetic memory programmable using spin transfer torque.

FIG. 12 depicts an exemplary embodiment of the magnetic junction 250 after step 160 is performed. Thus, a B-PMA layer 262 is shown on optional seed layer(s) 252. Also shown are the first I-PMA layer 264 and sacrificial layer 261. The seed layer(s) 252 may include an MgO layer. The B-PMA layer 262 and seed layer(s) 252 may be provided on the substrate 251. The B-PMA layer 252 and I-PMA layer 264 each includes magnetic moment 263 and 265, respectively. The layers 262, 264 and 261 are part of the pinned layer 260 being formed. Because the PMA energy exceeds the out-of-plane demagnetization energy for each of the layers 262 and 264, the magnetic moments 263 and 265 are perpendicular to plane. The thicknesses of the layers 262, 264 and 261 may be described as above. In the magnetic junction 250 shown, the pinned layer 260 being formed is not a SAF.

After the sacrificial layer 261 has been formed, an anneal is performed, via step 162. Step 162 is analogous to step 118, described above. The anneal thus heat treats the B-PMA layer 262, the first I-PMA layer 264 and the sacrificial layer 261. The anneal may be an RTA as described above. As discussed above, the stoichiometry of the layer 264 may change as a result of the anneal.

Figure 13:
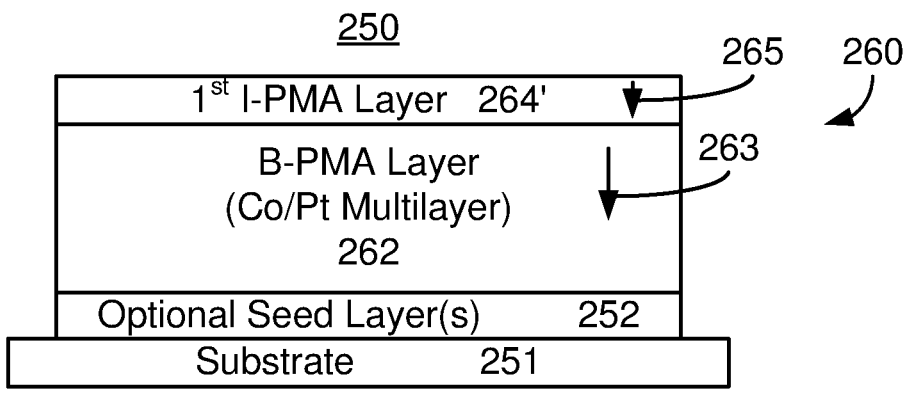

The sacrificial layer 261 and part of the first I-PMA layer 264 are removed, via step 164. Step 164 is analogous to step 120. In some embodiments, this is accomplished by plasma etching the magnetic junction 200. FIG. 13 depicts the magnetic junction 250 after step 164 is performed. Thus, the first I-PMA layer 264' remaining is thinner than the as-deposited I-PMA layer 264 depicted in FIG. 12. In some embodiments, the first I-PMA layer 264' has a thickness that does not exceed ten Angstroms. In some embodiments, the I-PMA layer 264' is at least two Angstroms thick and not more than six Angstroms thick. For example, the I-PMA layer 264' may be nominally five Angstroms thick.

A second I-PMA layer is provided, via step 166. The second I-PMA layer may be a CoFeB layer having a thickness of at least five Angstroms and not more than ten Angstroms. In some embodiments, the CoFeB layer may be at least seven Angstroms thick and not more than nine Angstroms thick. A third I-PMA layer is also provided on the second I-PMA layer, via step 168. The third I-PMA layer may be an FeB layer having a thickness of at least two Angstroms and not more than five Angstroms. Steps 166 and 168 may be analogous to step 122. In other embodiments, however, other material(s) may be used for the second and/or third I-PMA layers.

Figure 14:
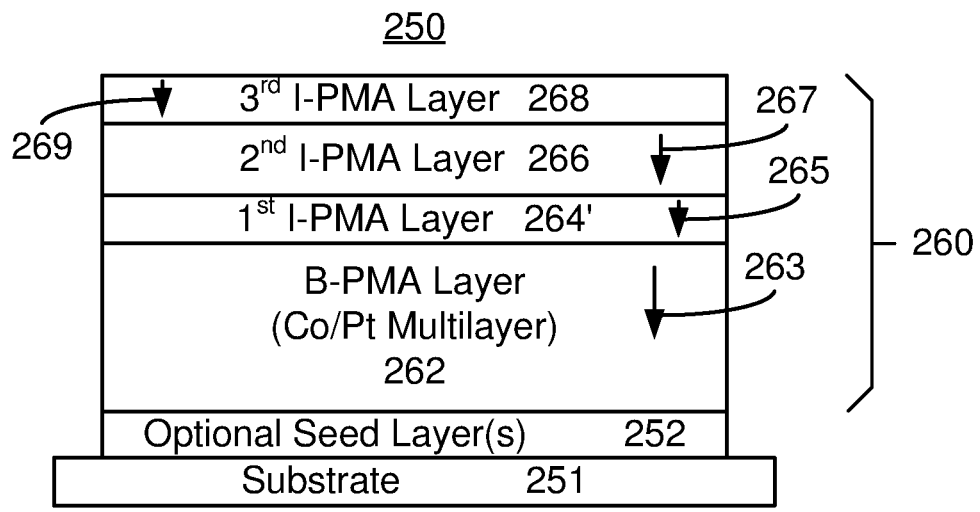

FIG. 14 depicts the magnetic junction 250 after step 168 has been performed. Thus, the second I-PMA layer 266 and third I-PMA layer 268 are shown. The I-PMA layers 266 and 268 each have a perpendicular magnetic anisotropy that exceeds the out-of-plane demagnetization energy. Thus, the magnetic moments 267 and 269 of the layers 266 and 268, respectively are perpendicular to plane. The layers 262, 264', 266 and 268 form the pinned layer 260. Thus, steps 152 through 1268 may be analogous to the step 102 of the method 100.

A nonmagnetic spacer layer is provided, via step 170. Step 170 may include depositing an MgO layer to form a tunneling barrier layer. A free layer that may have a free layer having perpendicular anisotropy energy that exceeds the free layer out-of-plane demagnetization energy is provided on the substrate, via step 172. Thus, the free layer may have a perpendicular-to-plane magnetic moment. Fabrication of the magnetic junction may then be completed, via step 174. For example, a capping layer, contacts, and/or other structures may be fabricated. The edges of the magnetic junction 250 may be defined if this has not previously been accomplished. In addition, if a dual magnetic junction is desired, then an additional nonmagnetic spacer layer and an additional pinned layer may be provided.

Figure 15:
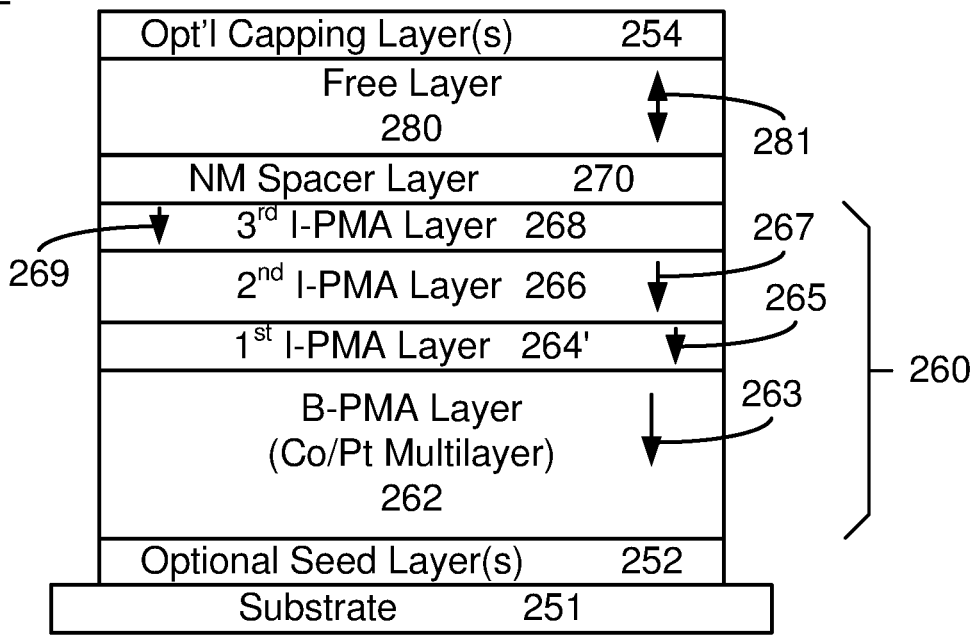

FIG. 15 depicts the magnetic junction 250 after step 174 has been performed. Thus, the nonmagnetic spacer layer 270 and free layer 280 having magnetic moment 281 are shown. The nonmagnetic spacer layer 270 may be an MgO tunneling barrier layer. The PMA energy of the free layer 280 exceeds the out-of-plane demagnetization energy of the free layer 280. Thus, magnetic moment 281 may be perpendicular to plane. In addition, optional capping layer(s) 254 are shown. The optional capping layer(s) 254 may include an MgO layer. Although not shown, top and bottom contacts may be provided to drive current perpendicular to plane through the magnetic junction. Thus, the magnetic junction 250 is a single magnetic junction. If desired, a dual magnetic junction may be formed.

Figure 16:
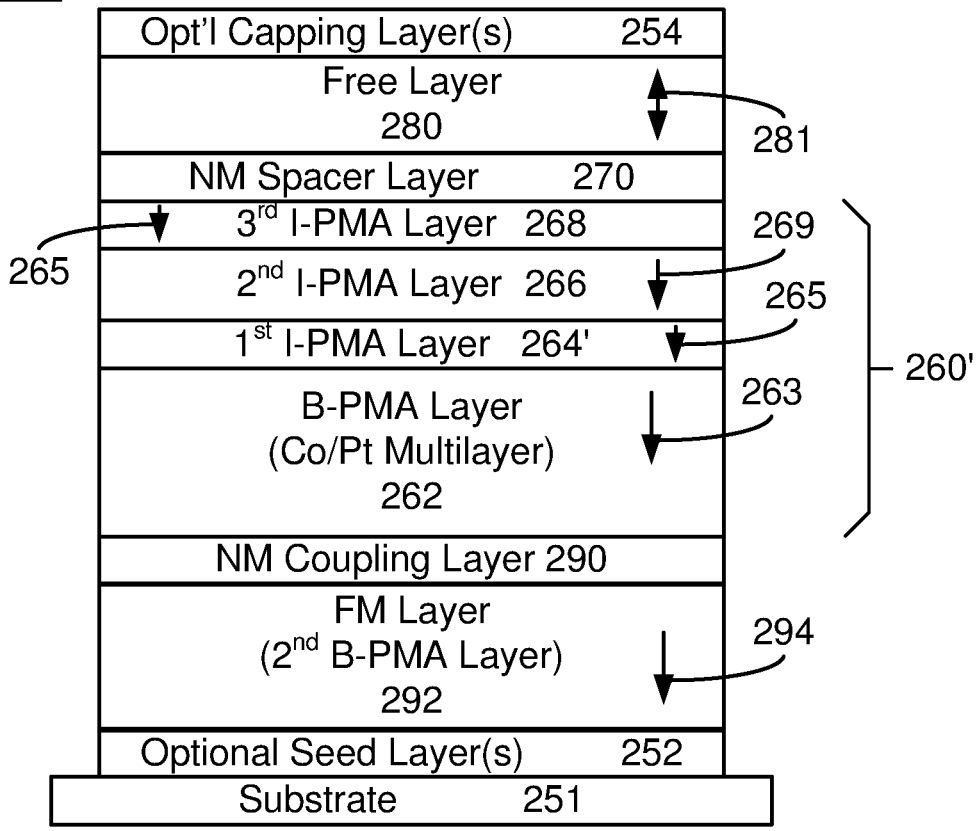
FIG. 16 depicts another exemplary embodiment of a magnetic junction including a high perpendicular magnetic anisotropy pinned layer and usable in a magnetic memory programmable using spin transfer torque.

FIG. 16 depicts another embodiment of a magnetic junction 250' after step 174 is completed. For clarity, FIG. 16 is not so scale and only certain structures are shown. The magnetic unction 250' is analogous to the magnetic junction 250. Thus, analogous components have similar labels. Thus, the magnetic junction 250' includes a pinned layer 260' including a B-PMA layer 262, I-PMA layers 264', 266 and 268, nonmagnetic spacer layer 270 and free layer 280 that reside on substrate 251 and are analogous to the layers 260, 262, 264', 266, 268, 270 and 280, respectively. Seed layer(s) 252 and capping layer(s) 254 that are analogous to the layers 252 and 254 described above.

In addition, the pinned layer 260' is a SAF. Thus, the pinned layer 260' includes another ferromagnetic layer 292 and a nonmagnetic coupling layer 290. The ferromagnetic layer 292 may be one or more B-PMA layers as shown. In some embodiments the ferromagnetic layer 292 may also include I-PMA layer(s).

Using the method 150, the magnetic junction 250 and/or 250' having improved performance may be formed. In particular, a bottom pinned layer 260 and/or 260' having a stable perpendicular to plane magnetic moment 263/265/267/269 has been provided. A higher spin polarization I-PMA layers 264', 266 and 268 may be used, allowing for improved writing. TMR may also be enhanced. Thus, performance the magnetic junction 250/250' formed using the method 150 may be improved.

Figure 17:
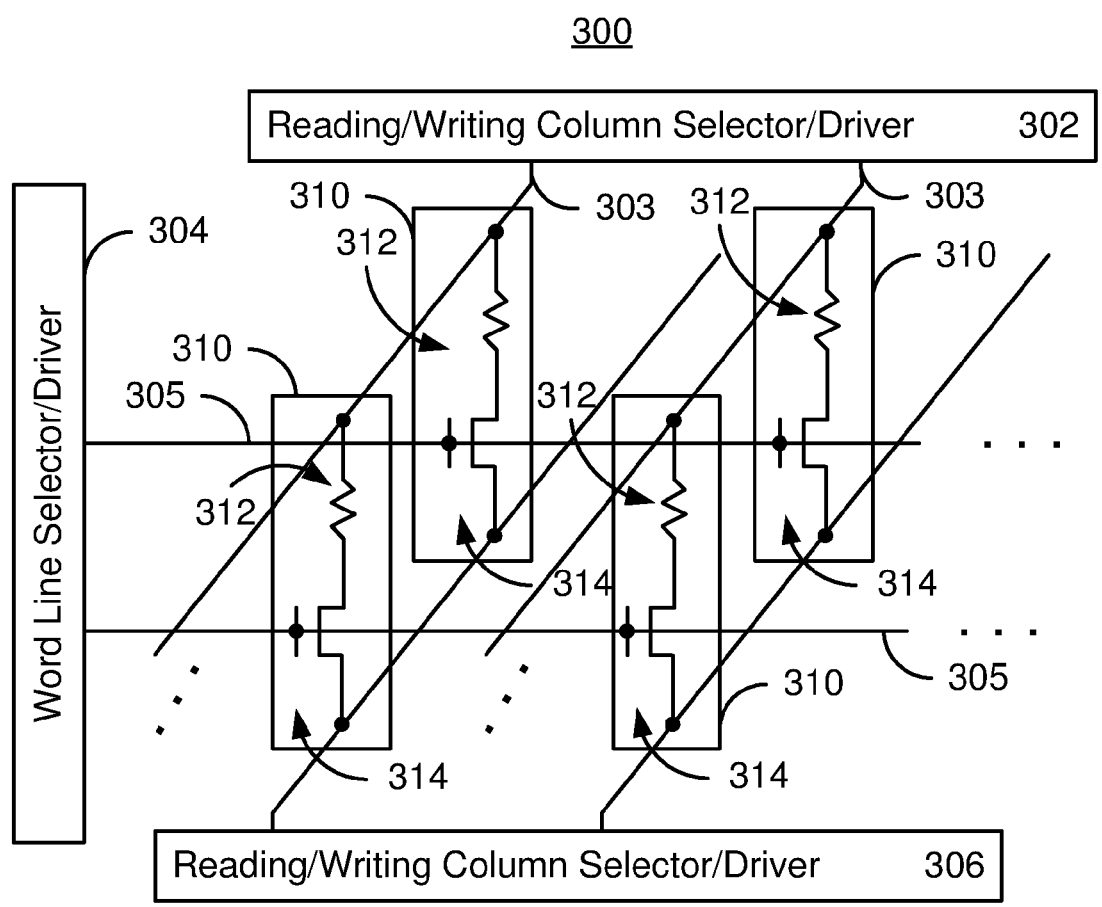
FIG. 17 depicts an exemplary embodiment of a memory utilizing magnetic junctions in the memory element(s) of the storage cell(s).

FIG. 17 depicts an exemplary embodiment of a memory 300 that may use one or more of the magnetic junctions 200, 200', 250 and/or 250' including pinned layer(s) 210, 260 and/or 260'. The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may be one of the magnetic junctions 200, 200', 250 and/or 250' disclosed herein. Although one magnetic junction 312 is shown per cell 310, in other embodiments, another number of magnetic junctions 312 may be provided per cell. As such, the magnetic memory 300 may enjoy the benefits described above.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for providing magnetic junction residing on a substrate and usable in a magnetic device, the method comprising:

providing a pinned layer, the pinned layer having a pinned layer perpendicular magnetic anisotropy energy greater than a pinned layer out-of-plane demagnetization energy, providing the pinned layer further including:
    providing a bulk perpendicular magnetic anisotropy (B-PMA) layer;
    providing a first interfacial perpendicular magnetic anisotropy (I-PMA) layer on the B-PMA layer, the first I-PMA layer including a constituent;
    providing a sacrificial layer on the first I-PMA layer, the sacrificial layer being a sink for the constituent;
    performing an anneal of at least the B-PMA layer, the first I-PMA layer and the sacrificial layer, the anneal being at an anneal temperature of at least two hundred degrees Celsius;
    removing the sacrificial layer and a portion of the first I-PMA layer after the anneal;
    providing at least one additional I-PMA layer on a remaining portion of the first I-PMA layer after removing the sacrificial layer, the remaining portion of the first I-PMA layer and the at least one additional I-PMA layer having a total thickness of not more than twenty Angstroms;
providing a nonmagnetic spacer layer; and
providing a free layer, the nonmagnetic spacer layer being between the pinned layer and the free layer, the pinned layer being between the free layer and the substrate, the free layer being switchable between a plurality of stable magnetic states when a write current is passed through the magnetic junction.

2. The method of claim 1 wherein the anneal temperature is at least three hundred degrees Celsius and not more than four hundred degrees Celsius.

3. The method of claim 1 further comprising:
performing an additional anneal after the free layer providing step, the additional anneal being at an additional anneal temperature of at least three hundred fifty degrees Celsius.

4. The method of claim 1 wherein the B-PMA layer includes at least one of a CoPt alloy, at least one Co/Pt bilayer, a CoTb alloy, at least one CoTb/FeB bilayer, at least one Co/Tb bilayer, a FePd alloy, a FePdB alloy, a CoPd alloy, a FePt alloy, a TbCoFe aloy, a GaMn alloy, a GeMn alloy at least one Co/Pd bilayer, at least one Fe/Pt bilayer, at least one Co/Ni bilayer, at least one Tb/CoFe bilayer, at least one Co/Ir bilayer and at least one Co/TbCoFe bilayer.

5. The method of claim 1 wherein the first I-PMA layer includes at least one of CoFeB, FeB, CoB, Fe, Co$_2$FeAl, Co$_2$FeAlSi, Co$_2$MnSi and MnAl.

6. The method of claim 1 wherein the at least one additional I-PMA layer includes a second I-PMA layer and a third I-PMA layer, the second I-PMA layer including a material selected from the first I-PMA material and an additional I-PMA material different from first I-PMA material, the third I-PMA layer including a second I-PMA material different from the first I-PMA material.

7. The method of claim 6 wherein the first I-PMA material is CoFeB and the second I-PMA material is FeB.

8. The method of claim 7 wherein the second I-PMA layer has a first thickness of at least five Angstroms and not more than ten Angstroms and wherein the third I-PMA layer has a second thickness of at least two Angstroms and not more than five Angstroms.

9. The method of claim 8 wherein the first I-PMA layer is CoFeB and wherein the constituent is B.

10. The method of claim 1 wherein the sacrificial layer include a Ta layer having a Ta thickness of at least two Angstroms and not more than five Angstroms.

11. The method of claim 1 wherein providing the pinned layer further includes:
    providing a first magnetic layer,
    providing a nonmagnetic layer on the first magnetic layer, the first magnetic layer being antiferromagnetically coupled with the B-PMA layer.

12. The method of claim 11 wherein the first magnetic layer is an additional B-PMA layer.

13. The method of claim 1 further comprising:
    providing an additional nonmagnetic spacer layer on the free layer, the free layer being between the nonmagnetic spacer layer and the additional nonmagnetic spacer layer; and
    providing an additional pinned layer on the additional nonmagnetic spacer layer, the additional nonmagnetic spacer layer being between the additional pinned layer and the free layer.

14. The method of claim 1 wherein the removing step further includes:
    plasma etching the sacrificial layer.

15. A method for providing magnetic junction residing on a substrate and usable in a magnetic device, the method comprising:
    providing a pinned layer, the pinned layer having a pinned layer perpendicular magnetic anisotropy energy greater than a pinned layer out-of-plane demagnetization energy, of providing the pinned layer further including:
        providing a bulk perpendicular magnetic anisotropy (B-PMA) layer, the B-PMA layer including at least one of a CoPt alloy, at least one Co/Pt bilayer, a CoTb alloy, at least one CoTb/FeB bilayer, at least one Co/Tb bilayer, a FePd alloy, a FePdB alloy, a CoPd alloy, a FePt alloy, a TbCoFe aloy, a GaMn alloy, at least one Co/Pd bilayer, at least one Fe/Pt bilayer, at least one Co/Ni bilayer, at least one Tb/CoFe bilayer and at least one Co/TbCoFe bilayer;
        performing a B-PMA anneal after the B-PMA layer is provided;
        providing a first interfacial perpendicular magnetic anisotropy (I-PMA) layer on the B-PMA layer after the B-PMA anneal, the I-PMA layer including B;
        providing a Ta sacrificial layer on the first I-PMA layer, the Ta sacrificial layer being a sink for the B;
        performing an anneal of at least the first I-PMA layer and the Ta sacrificial layer, the anneal being at an anneal temperature of at least three hundred degrees Celsius;
        performing at least one plasma etch to remove the Ta sacrificial layer and a portion of the first I-PMA layer after the anneal;
        providing a CoFeB layer on a remaining portion of the first I-PMA layer after the removing the Ta sacrificial layer step, the CoFeB layer being at least five Angstroms and not more than ten Angstroms thick; and
        providing a FeB layer on the CoFeB layer, the FeB layer being at least two Angstroms and not more than five Angstroms thick;
    providing a nonmagnetic spacer layer; and
    providing a free layer, the nonmagnetic spacer layer being between the pinned layer and the free layer, the pinned layer being between the free layer and the substrate, the free layer being switchable between a plurality of stable magnetic states when a write current is passed through the magnetic junction.

16. The method of claim 15 further comprising:
performing an additional anneal after the free layer providing step, the additional anneal being at an additional anneal temperature of at least three hundred fifty degrees Celsius.

17. A memory magnetic junction residing on a substrate and comprising:
a plurality of magnetic storage cells, each of the plurality of magnetic storage cells including at least one magnetic junction, the at least one magnetic junction including a free layer, a nonmagnetic spacer layer, and a pinned layer, the free layer being switchable between a plurality of stable magnetic states when a write current is passed through the magnetic junction, the nonmagnetic spacer layer residing between the pinned layer and the free layer, the nonmagnetic spacer layer and the free layer being between the pinned layer and the substrate, the pinned layer having a pinned layer perpendicular magnetic anisotropy energy greater than a pinned layer out-of-plane demagnetization energy, the pinned layer including a bulk perpendicular magnetic anisotropy (B-PMA) layer, a first interfacial perpendicular anisotropy (I-PMA) layer on the B-PMA layer, and at least one additional I-PMA layer on the first I-PMA layer, the first I-PMA layer sharing a first interface with the B-PMA layer and a second interface with the at least one additional I-PMA layer, the first I-PMA layer and the at least one additional I-PMA layer having a total thickness of not more than twenty Angstroms; and
a plurality of bit lines coupled with the plurality of magnetic storage cells.

\* \* \* \* \*